(12) United States Patent
Jang

(10) Patent No.: US 9,716,493 B2
(45) Date of Patent: Jul. 25, 2017

(54) INPUT CIRCUIT AND SEMICONDUCTOR APPARATUS INCLUDING THE INPUT CIRCUIT

(71) Applicant: SK hynix Inc., Icheon-si Gyeonggi-do (KR)

(72) Inventor: Yeonsu Jang, Icheon-si (KR)

(73) Assignee: SK hynix Inc., Incheon-si, Gyeonggi-do (KR)

(*) Notice: Subject to any disclaimer, the term of this patent is extended or adjusted under 35 U.S.C. 154(b) by 0 days.

(21) Appl. No.: 14/927,780

(22) Filed: Oct. 30, 2015

(65) Prior Publication Data

US 2017/0012613 A1    Jan. 12, 2017

(30) Foreign Application Priority Data

Jul. 10, 2015    (KR) .................. 10-2015-0098649

(51) Int. Cl.
| | | |
|---|---|---|
| *H03K 3/00* | (2006.01) | |
| *H03K 5/24* | (2006.01) | |
| *H03K 19/003* | (2006.01) | |
| *H03K 19/0185* | (2006.01) | |

(52) U.S. Cl.
CPC ..... *H03K 5/2481* (2013.01); *H03K 19/00315* (2013.01); *H03K 19/018528* (2013.01)

(58) Field of Classification Search
None
See application file for complete search history.

(56) References Cited

U.S. PATENT DOCUMENTS

| | | | | |
|---|---|---|---|---|
| 6,697,205 B2* | 2/2004 | Cyrusian | .......... | G11B 20/10055 327/110 |
| 6,903,588 B2* | 6/2005 | Vorenkamp | ...... | H03K 19/00361 327/112 |
| 7,005,903 B2* | 2/2006 | Chan | ................ | H03K 19/00384 327/108 |
| 7,262,637 B2* | 8/2007 | Pan | ...................... | H03K 17/145 326/29 |
| 7,362,173 B1 | 4/2008 | Knausz | | |
| 7,808,304 B1* | 10/2010 | Zhang | .................. | H03K 17/223 327/108 |
| 2010/0327841 A1 | 12/2010 | Ito et al. | | |
| 2012/0001663 A1* | 1/2012 | Willey | ............. | H03K 19/01851 327/109 |

* cited by examiner

*Primary Examiner* — Lincoln Donovan
*Assistant Examiner* — Khareem E Almo
(74) *Attorney, Agent, or Firm* — William Park & Associates Ltd.

(57) ABSTRACT

An input circuit and a semiconductor apparatus having the input circuit are provided. The input circuit may include a bias generation unit configured to generate a bias voltage. The input circuit may include a buffer unit configured to be driven according to the bias voltage and generate an internal signal by receiving a reference signal and an external signal.

16 Claims, 3 Drawing Sheets

INPUT CIRCUIT AND SEMICONDUCTOR APPARATUS INCLUDING THE INPUT CIRCUIT

CROSS-REFERENCES TO RELATED APPLICATION

This application claims priority under 35 U.S.C. 119(a) to Korean application No. 10-2015-0098649, filed on Jul. 10, 2015, in the Korean intellectual property Office, which is incorporated by reference in its entirety as set forth in full.

BACKGROUND

1. Technical Field

Various embodiments generally relate to a semiconductor integrated circuit device, and more particularly, to an input circuit and a semiconductor apparatus including the input circuit.

2. Related Art

Semiconductor apparatuses use input circuits as interfaces, The input circuits convert an externally applied signal to a level usable in internal circuits of the semiconductor apparatuses.

The input circuit may be provided in an input terminal for receiving an address, data, clock signal, a control signal, and the like. The input circuit may be designed in consideration of an operation voltage, a reference voltage level, and a swing width of an input signal in the semiconductor apparatus.

The input circuit may be operated through a current source generated based on an operation voltage. The input circuit has to output an internal signal having a desired level regardless of change in the operation conditions such as change in the level of the externally applied signal, or change in the level of the operation voltage or the reference voltage.

SUMMARY

According to an embodiment, there is provided an input circuit. The input circuit may include a bias generation unit configured to generate a bias voltage in response to an enable signal. The input circuit may include a buffer unit configured to be driven according to the bias voltage and generate an internal signal by receiving a reference signal and an external signal.

According to an embodiment, there is provided a semiconductor apparatus. The semiconductor apparatus may include an input circuit configured to generate an internal signal by receiving an external signal. The semiconductor apparatus may include an internal circuit configured to be operated by receiving the internal signal. The input circuit may include a bias generation unit configured to generate the bias voltage in response to an enable signal. The input circuit may include a buffer unit configured to be driven according to the bias voltage and generate the internal signal by receiving a reference signal and the external signal.

According to an embodiment, there is provided an input circuit. The input circuit may include a buffer unit configured to be driven according to a bias voltage received by the buffer unit regardless of a level change of an external signal and reference signal received by the buffer unit, and output an internal signal.

DETAILED DESCRIPTION

Figure 1:
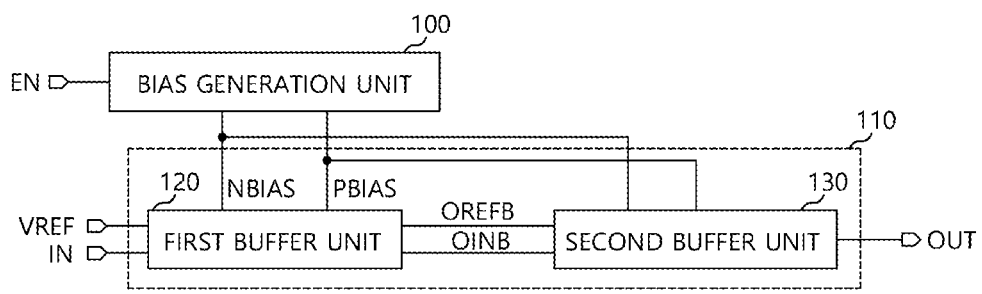
FIG. 1 is a configuration diagram illustrating a representation of an example of an input circuit according to an embodiment.

Various examples of embodiments will be described below with reference to the accompanying drawings. Various examples are described herein with reference to cross-sectional illustrations that are schematic illustrations of the examples of the embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The embodiments are described herein with reference to cross-section and/or plan illustrations of various embodiments. However, the embodiments should not be construed as limiting. Although a few embodiments of the disclosure will be illustrated and described, it will be appreciated by those of ordinary skill in the art that changes may be made in these embodiments without departing from the principles and spirit of the descriptions.

FIG. 1 is a configuration diagram illustrating a representation of an example of an input circuit according to an embodiment.

Referring to FIG. 1, an input circuit 10 according to an embodiment may include a bias generation unit 100 and a buffer unit 110.

The bias generation unit 100 may be configured to generate a bias voltage in response to an enable signal EN. The bias voltage may include a first bias voltage NBIAS and a second bias voltage PBIAS. In an embodiment, the bias generation unit 100 may employ a current source capable of generating a small amount of constant current using a relatively small resistor. In an embodiment, the bias generation unit 100 may employ a Widlar current source.

The buffer unit 110 may be configured to operate according to the first bias voltage NBIAS and the second bias voltage PBIAS, and to generate an internal signal OUT by receiving a reference signal VREF and an external signal IN.

In an embodiment, the first bias voltage NBIAS may be used as a voltage for driving a sink current of the buffer unit 110, and the second bias voltage PBIAS may be used for driving a source current of the buffer unit 110. The reference signal VREF may be provided from the inside or outside of a semiconductor apparatus.

In an embodiment, the buffer unit 110 may be a multistage buffer circuit and include a first buffer unit 120 and a second buffer unit 130. The first buffer unit 120 may be driven according to the first bias voltage NBIAS and the second bias voltage PBIAS, and may generate a first comparison signal OREFB and a second comparison signal OINB by receiving the reference signal VREF and the external signal IN.

The second buffer unit 130 may be driven according to the first bias voltage NBIAS and the second bias voltage PBIAS, and may generate an internal signal OUT by receiving the first comparison signal OREFB and the second comparison signal OINB.

In an embodiment, the current source for driving the buffer unit 110 may be driven by the first bias voltage NBIAS and the second bias voltage PBIAS provided from the bias generation unit 100. Therefore, even when the operation voltage is lowered, or the levels of the input signals VREF and IN are changed, the buffer unit 110 may normally operate by the first and second bias voltages NBIAS and PBIAS provided from the bias generation unit 110.

Figure 2:
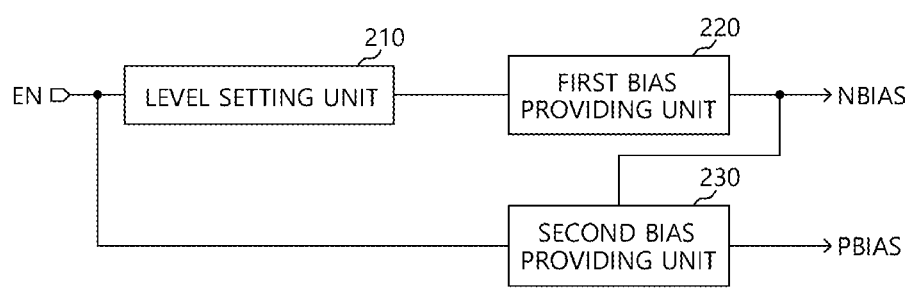
FIG. 2 is a configuration diagram illustrating a representation of an example of a bias generation unit according to an embodiment.

FIG. 2 is a configuration diagram illustrating a representation of an example of a bias generation unit according an embodiment.

Referring to FIG. 2, the bias generation unit 100 may include a level setting unit 210, a first bias providing unit 220, and a second bias providing unit 230.

The level setting unit 210 may be configured to generate an operation current having a preset level in response to the enable signal EN.

The first bias providing unit 220 may be configured to generate the first bias voltage NBIAS in response to the operation current generated from the level setting unit 210.

The second bias providing unit 230 may be configured to generate the second bias voltage PBIAS in response to the enable signal EN and the first bias voltage NBIAS.

In an embodiment, when the enable signal EN is enabled, the first bias voltage NBIS and the second bias voltage PBIAS may be generated to levels capable of turning on the current sink element and the current source element constituting the buffer 110. When the enable signal EN is disabled, the first bias voltage NBIS may be generated to a level capable of turning off a switching element constituting the buffer 110, that is, a ground voltage VSS level, and the second bias voltage PBIAS may be generated to a level capable of turning off a switching element constituting the buffer 110, that is, a power voltage VDD level.

Figure 3:
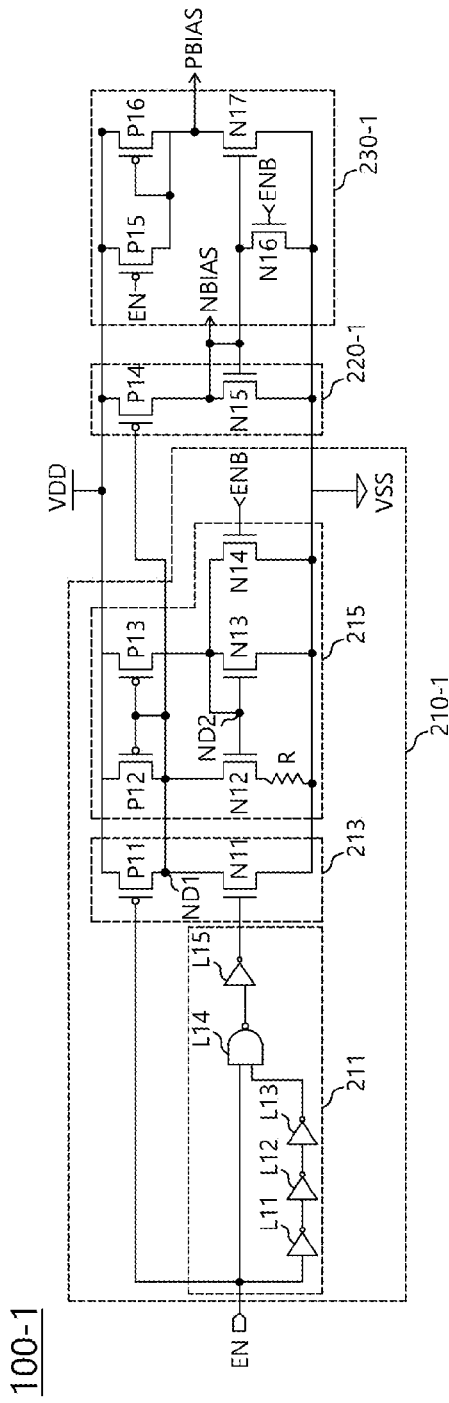
FIG. 3 is a circuit diagram illustrating a representation of an example of a bias generation unit according to an embodiment.

FIG. 3 is a circuit diagram illustrating a representation of an example of a bias generation unit according to an embodiment.

Referring to FIG. 3, a bias generation unit 100-1 may include a level setting unit 210-1, a first bias providing unit 220-1, and a second bias providing unit 230-1.

The level setting unit 210-1 may be configured to be driven in response to the enable signal EN and to generate an operation current by receiving the power voltage VDD.

In an embodiment, the level setting unit 210-1 may include a pulse generator 211, a driver 213, and an operation current generator 215.

The pulse generator 211 may include delay units L11, L12, and L13, and combination units L14 and L15. The delay units L11, L12, and L13 may be configured to delay the enable signal EN for a certain time. The combination units L14 and L15 may be configured to generate a pulse signal through a combination of the enable signal EN and output signals of the delay units L11, L12, and L13.

The driver 213 may be configured to be driven in response to the enable signal EN and the pulse signal output from the pulse generator 211, and to generate a driving current corresponding to the power voltage VDD level. The pulse generator 211 and the driver 213 may function as a start-up circuit configured to set an initial value of the operation current generator 215.

In an embodiment, the driver 213 may be configured to include a first switching element P11 and a second switching element N11. The first switching element P11 may be driven in response to the enable signal EN and to provide a driving current to a first node ND1 by receiving the power voltage VDD. The second switching element N11 may be configured to be driven in response to the pulse signal output from the pulse generator 211, and coupled between the first node ND1 and a ground terminal VSS.

The operation current generator 215 may be configured to be driven by the driving current applied to the first node ND1 and to generate the operation current by changing a current amount of the first node ND1 according to a preset resistance value. In an embodiment, the operation current generator 215 may be a current mirror circuit including a resistor element R as a source degeneration resistor.

In an embodiment, the operation current generator 215 may include third to seventh switching elements P12, P13, N12, N13, and N14 and a resistor element R.

The third switching element P12 may be driven by a voltage applied to the first node ND1 and coupled between a power voltage VDD supply terminal and the first node ND1. That is, the third switching element P12 may be diode-coupled between the first node ND1 and the power voltage VDD supply terminal.

The fourth switching element P13 may be driven by the voltage applied to the first node ND1, and coupled between the power voltage VDD supply terminal and a second node ND2.

The fifth switching element N12 and the resistor element 5 may be coupled in series between the first node ND1 and the ground terminal VSS. The fifth switching element N12 may be driven by a voltage applied to the second node ND2. Therefore, a current amount applied to the first node ND1 may be determined according to driving of the fifth switching element N12 and a size of the resistor element R.

The sixth switching element N13 may be driven by the voltage applied to the second node ND2 and coupled between the second node ND2 and the ground terminal VSS. That is, the sixth switching element N13 may be diode-coupled between the second node ND2 and the ground terminal VSS.

The seventh switching element N14 may be driven by an inverted enable signal ENB and coupled between the second node ND2 and the ground terminal VSS. The second switching element N14 may be operated as a reset circuit of the bias generating unit 100-1.

In the level setting unit 210-1, when the enable signal EN is enabled, the driving current generated in the driver 213 may be applied to the first node ND1. The operation current generator 215 may be driven by the driving current, and may cause the operation current to be applied to the first node ND1 by adjusting a driving current amount according to the size of the resistor element R.

For example, when the enable signal EN is enabled to a high level, the first switching element P11 is turned off, and a low-level voltage may be applied to the first node ND1. The third and fourth switching elements P12 and P13 may be turned on according to the low-level voltage applied to the first node ND1.

A voltage corresponding to a value in which a threshold voltage of the fourth switching element P13 is subtracted from the power voltage VDD may be applied to the second node ND2, and the fifth and sixth switching elements N12 and N13 may be turned on. The inverted enable signal ENB may be a low level, and the seventh switching element N14 may be turned off.

Accordingly, the operation current of which the driving current amount is changed by an amount corresponding to the size of the resistor element R may be applied to the first node ND1.

The first bias providing unit 220-1 may be configured to be driven by the driving current applied to the first node ND1 and to generate the first bias voltage NBIS.

In an embodiment, the first bias providing unit 220-1 may include eighth and ninth switching elements P14 and P15 coupled in series between the power voltage VDD supply terminal and the ground terminal VSS.

The eighth switching element P14 may be configured to receive the power voltage VDD, and to be driven according to a voltage level applied to the first node ND1 to output the first bias voltage NBIAS.

The ninth switching element N15 may be configured to be diode-coupled between an output node of the first bias voltage NBIAS and the ground terminal VSS.

When the enable signal EN is enabled, that is, when the input circuit 10 is enabled, the first bias voltage NBIAS should be generated to a level capable of turning on switching elements (for example, NMOS switching elements) constituting the buffer unit 110. Accordingly, the size of the resistor element R constituting the operation current generator 215 may be determined complying with a target level of the first bias voltage NBIAS.

The second bias providing unit 230-1 may be configured to be driven in response to the inverted enable signal ENB and to generate the second bias voltage PBIAS from the power voltage VDD.

In an embodiment, the second bias providing unit 230-1 may include tenth to thirteenth switching elements P15, P16, N16, and N17.

The tenth switching element P15 may be configured to be driven in response to the enable signal EN and coupled between the power voltage VDD supply terminal and an output node of the second bias voltage PBIAS.

The eleventh switching element P16 may be configured to be diode-coupled between the power voltage VDD supply terminal and the output node of the second bias voltage PBIAS.

The twelfth switching element N16 may be driven in response to the inverted enable signal ENB and may be coupled between the output node of the first bias voltage NBIAS and the ground terminal VSS.

The thirteenth switching element N17 may be driven by the first bias voltage NBIAS and may be coupled between the output node of the second bias voltage PBIAS and the ground terminal VSS.

When the enable signal EN is a high level, that is, when the input circuit 10 is enabled, the tenth switching element P15 may be turned off, and the eleventh switching element P16 may be turned on. The twelfth switching element N16 may be turned off, and the thirteenth switching element N17 may be turned on.

Accordingly, the level of the second bias voltage PBIAS may be controlled according to sizes of the eleventh and thirteen switching elements P16 and P17. In an embodiment, when the enable signal EN is enabled, the second bias voltage PBIAS may be generated to a level capable of turning on switching elements (for example, PMOS switching elements) constituting the buffer unit 110. In an embodiment, the second bias voltage PBIAS may be generated to a level 0.05 to 0.15 higher than a turn-on level of the switching element (for example, PMOS switching elements) constituting the buffer unit 110, but this is merely an example and the embodiments are not limited to these levels or in this manner.

Figure 4:
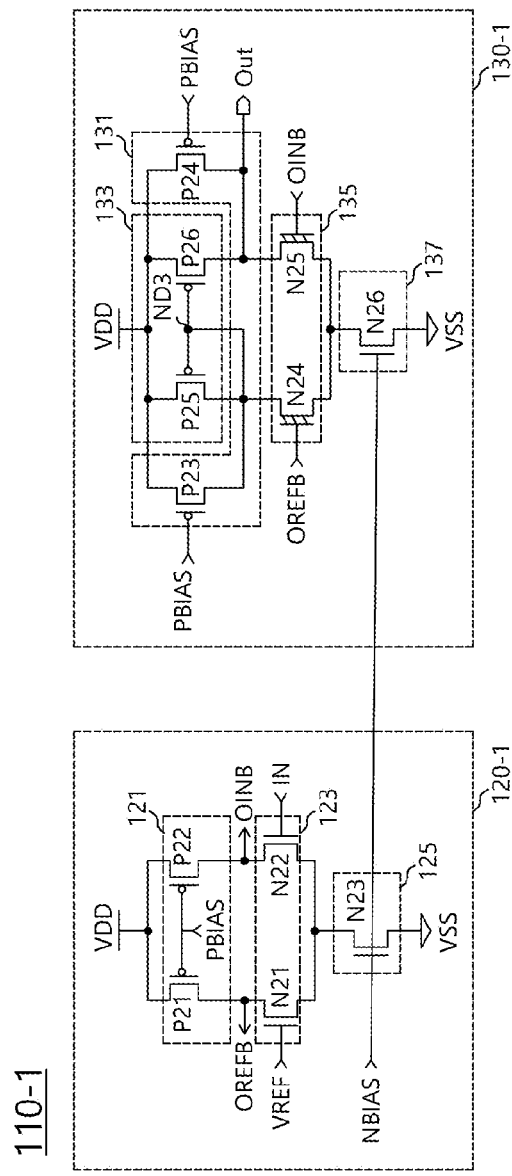
FIG. 4 is a configuration diagram illustrating a representation of an example of a buffer unit according to an embodiment.

FIG. 4 is a configuration diagram illustrating a representation of an example of a buffer unit according to an embodiment.

As illustrated in FIG. 4, a buffer unit 110-1 may be a two-stage buffer circuit, and for example, the buffer unit 100-1 may include a first buffer unit 120-1 and a second buffer unit 130-1.

The first buffer unit 120-1 may be configured to be driven in response to the first bias voltage NBIAS and the second bias voltage PBIAS, and to generate the first comparison signal OREFB and the second comparison OINB by comparing the reference signal VREF with the external signal IN.

In an embodiment, the first buffer unit 120-1 may include a current source unit 121, a comparator 123, and a sink unit 125.

The current source unit 121 may include a fourteenth switching element P21 and the fifteenth switching element P22.

The fourteenth switching element P21 may be configured to be driven in response to the second bias voltage PBIAS, and to supply a source current to an output node of the first comparison signal OREFB by receiving the power voltage VDD. The fifteenth switching element P22 may be configured to be driven in response to the second bias voltage PBIAS, and to supply a source current to an output node of the second comparison signal OINB by receiving the power voltage VDD.

The comparator 123 may include a sixteenth switching element N21 and a seventeenth switching element N22.

The sixteenth switching element N21 may be configured to be coupled between the output node of the first comparison signal OREFB and the sink unit 125, and to receive the reference signal VREF. The seventeenth switching element N22 may be coupled between the output node of the second comparison signal OINB and the sink unit 125 and to receive the external signal IN.

The sink unit 125 may be configured to include an eighteenth switching element N23 coupled between the comparator 123 and the ground terminal VSS and driven in response to the first bias voltage NBIAS. That is, the sink unit 125 may be configured to be operated using the first bias voltage NBIAS as the sink current.

When the input circuit 10 is enabled, for example, the enable signal EN is enabled to a high level, the first bias voltage NBIAS may be generated to a level capable of turning on the eighteenth switching element N23 constituting the sink unit 125. The second bias voltage PBIAS may be generated to a level capable of turning on the fourteenth and fifteenth switching elements P21 and P22 constituting the current source unit 121. Accordingly, the current source unit 121 and the sink unit 125 constituting the first buffer unit 120-1 may be normally operated regardless of variation of external environments and lowering of the operation voltage, and may generate the first and second comparison signals OREFB and OINB by comparing the reference signal VREF and the external signal IN.

In an embodiment, when a level of the external signal IN is higher than a level of the reference signal VREF, the first buffer unit 120-1 may output the second comparison signal OINB to a level lower than that of the first comparison signal OREFB. When the level of the external signal IN is lower than that of the reference signal VREF, the first buffer 120-1 may output the second comparison signal OINB to a level higher than the level of the first comparison signal OREFB.

The second buffer unit 130-1 may include a current source unit 131, a current providing unit 133, a comparator 135, and a sink unit 137.

The current source unit 131 may include a nineteenth switching unit P23 and a twentieth switching element P24.

The nineteenth switching element P23 may be driven in response to the second bias voltage PBIAS and coupled between the power voltage VDD supply terminal and a third node ND3. The twentieth switching element P24 may be driven in response to the second bias voltage PBIAS and coupled between the power voltage VDD supply terminal and the output terminal OUT.

The current providing unit 133 may include a 21st switching element P25 and a 22nd switching element P26.

The 21st switching element P25 may be driven by a voltage applied to the third node ND3 and coupled between the power voltage VDD supply terminal and the third node ND3. The 22nd switching element P26 may be driven by the voltage applied to the third node ND3 and coupled between the power voltage VDD supply terminal and the output terminal OUT.

The comparator 135 may include a 23rd switching element N24 and a 24th switching element N25.

The 23rd switching element N24 may be coupled between the third node ND3 and the sink unit 137 and driven in response to the first comparison signal OREFB. The 24th switching element N25 may be coupled between the output node OUT and the sink unit 137 and driven in response to the second comparison signal OINB.

The sink unit 137 may be coupled between the comparator 135 and the ground terminal VSS and include a 25th switching element N26 in response to the first bias voltage NBIAS. That is, the sink unit 137 may be configured to be operated using the first bias voltage NBIAS as a sink current.

The first bias voltage NBIAS and the second bias voltage PBIAS may be used as the driving voltages for operating the current source of the second buffer unit 130-1. The output current of the current providing unit 133 may be reinforced through the current source unit 131. Therefore, even when the switching elements P25 and P26 constituting the current source unit 133 have high threshold values, the switching elements P23 and P24 constituting the current source unit 131 may be designed to be turned on by the second bias voltage PBIAS, and thus the second buffer unit 130-1 may be normally operated without an error.

For the normal operation of the second buffer unit 130-1, the current source unit 131 and the current providing unit 133 have to be operated in a saturation region and use the second bias voltage PBIAS generated through the bias generation unit 100 and 100-1 as the driving voltage as in an embodiment, and thus the second buffer unit 130-1 and further the buffer unit 110-1 may be normally operated regardless of the change in the external environments.

The input circuit 10 according to an embodiment may be operated by the bias voltages NBIAS and PBIAS provided from the bias generating unit 100 and 100-1. Therefore, when the enable signal EN is disabled, the bias generating units 100 and 100-1 may be turned off, the first bias voltage NBIAS having a ground voltage level may be generated, and the second bias voltage PBIAS having a power voltage VDD level may be generated. Accordingly, the buffer unit 110 may be also turned off, and thus an unnecessary operation of the input circuit 10 and current consumption due to the unnecessary operation may be prevented.

Figure 5:
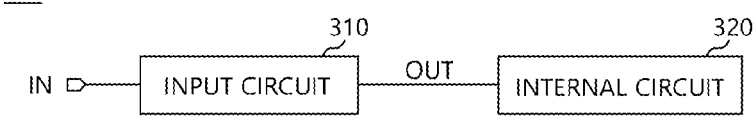
FIG. 5 is a configuration diagram illustrating a representation of an example of a semiconductor apparatus according to an embodiment.

FIG. 5 is a configuration diagram illustrating a representation of an example of a semiconductor apparatus according to an embodiment.

A semiconductor apparatus 30 according to an embodiment may include an input circuit 310 and an internal circuit 320.

The input circuit 310 may generate an internal signal OUT by receiving an external signal IN.

The internal circuit 320 may perform a desired operation by receiving the internal signal OUT. In an embodiment, the internal circuit 320 may include a semiconductor memory device. The semiconductor memory device may be a volatile memory device such as a dynamic random access memory (DRAM) or a nonvolatile memory device such as a flash memory or a resistive memory.

The input circuit 10 which has been described in FIGS. 1 to 4 may be used as the input circuit 310. That is, the input circuit 310 may be configured to be operated using a current source driven according to the bias generated in the bias generation unit 100.

Figure 6:
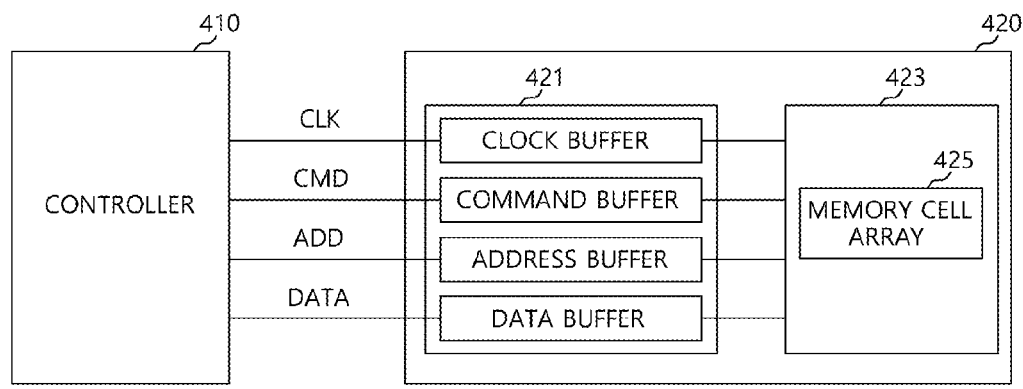
FIG. 6 is a configuration diagram illustrating a representation of an example of a semiconductor apparatus according to an embodiment.

FIG. 6 is a configuration diagram illustrating a representation of an example of a semiconductor apparatus according to an embodiment.

A semiconductor apparatus 40 according to an embodiment may include a controller 410 and a memory device 420.

The memory device 420 may include an input circuit 421 and a memory core 423. The memory core 423 may include a memory cell array 425. The memory device 420 may be a volatile memory device such as a DRAM or a nonvolatile memory device such as a flash memory or a resistive memory, but the memory device 420 is not limited thereto.

Although not illustrated in FIG. 6, the memory core 423 may include components which may read out data from the memory cell array 425 and write data to the memory cell array 425. For example, the memory core 423 may include an address decoder, a write circuit unit, a read-out circuit unit, and the like.

The memory device 420 may receive a clock signal CLK, a command CMD, an address ADD, data DATA, and the like from the controller 410, and transmit data DATA stored in the memory cell array 425 to the controller 410 according to a request of the controller 410.

The input circuit 421 may include a clock buffer configured to convert the clock signal CLK provided from the controller 410 to an internal clock signal, a command buffer configured to convert the command CMD to an internal command, an address buffer configured to converter the address ADD to an internal address, a data buffer configured to convert the data DATA to internal data, and the like.

Each or at least one of the clock buffer, the command buffer, the address buffer, the data buffer, and the like may be configured using the input circuit 10 described in FIGS. 1 to 4.

Each or at least one of the clock buffer, the command buffer, the address buffer, data buffer, and the like constituting the input circuit 421 may be operated using a current source driven according to the bias generated from the bias generation unit 100, and convert the external signal to the internal signal.

In the technology, the bias generation unit such as a Widlar current source may be used as the current source of the input circuit. The Widlar current source may be a circuit which generates a small amount of constant current using a relatively small resistor, and may be advantageous to considerably save a chip area. The bias generation unit in the technology may generate a bias having a level capable of turning on a switching element constituting a buffer unit, and thus the input circuit may be normally operated even when the external environment is changed. Accordingly, reliability of a semiconductor apparatus employing the input circuit may be guaranteed.

The above embodiments of the present disclosure are illustrative and not limitative. Various alternatives and equivalents are possible. The disclosure is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. An input circuit comprising:
   a bias generation unit configured to generate a first bias voltage and a second bias voltage;
   a first buffer unit configured to be turned on or turned off according to the first bias voltage and the second bias voltage, and generate a first comparison signal and a second comparison signal by comparing a reference signal and an external signal; and
   a second buffer unit configured to be turned on or turned off according to the first bias voltage and the second bias voltage, and generate an internal signal by comparing the first comparison signal and the second comparison signal received from the first buffer unit.

2. The input circuit of claim 1, wherein the first bias voltage is configured to drive a sink current of the first buffer unit and the second buffer unit, and the second bias voltage is configured to drive a source current of the first buffer unit and the second buffer unit as the bias voltage.

3. The input circuit of claim 1,
   wherein the bias generation unit is configured to generate the first bias voltage and the second bias voltage in response to an enable signal, and
   wherein the bias generation unit includes:
   a level setting unit configured to generate an operation current having a preset level in response to the enable signal;
   a first bias providing unit configured to generate the first bias voltage in response to the operation current; and
   a second bias providing unit configured to generate the second bias voltage in response to the enable signal and the first bias voltage.

4. The input circuit of claim 3, wherein the level setting unit includes:
   a pulse generator configured to generate a pulse signal in response to the enable signal;
   a driver configured to be driven in response to the enable signal and the pulse signal and generate a driving current by receiving a power voltage; and
   an operation current generator configured to be driven in response to the driving current and generate the operation current by changing the driving current according to a preset resistance value.

5. The input circuit of claim 1, wherein the bias generation unit is configured to include a Widlar current source.

6. A semiconductor apparatus comprising:
   an input circuit configured to generate an internal signal by receiving an external signal; and
   an internal circuit configured to be operated by receiving the internal signal,
   wherein the input circuit includes:
   a bias generation unit configured to generate the bias voltage including a first bias voltage and a second bias voltage;
   a first buffer unit configured to be turned on or turned off according to the first bias voltage and the second bias voltage, and generate a first comparison signal and a second comparison signal by comparing a reference signal and an external signal; and
   a second buffer unit configured to be turned on or turned off according to the first bias voltage and the second bias voltage, and generate an internal signal by comparing the first comparison signal and the second comparison signal received from the first buffer unit.

7. The semiconductor apparatus of claim 6, wherein the first bias voltage is configured to drive a sink current of the buffer unit, and the second bias voltage is configured to drive a source current of the buffer unit as the bias voltage.

8. The semiconductor apparatus of claim 6,
   wherein the bias generation unit is configured to generate the first bias voltage and second bias voltage in response to an enable signal, and
   wherein the bias generation unit includes:
   a level setting unit configured to generate an operation current having a preset level in response to the enable signal;
   a first bias providing unit configured to generate the first bias voltage in response to the operation current; and
   a second bias providing unit configured to generate the second bias voltage in response to the enable signal and the first bias voltage.

9. The semiconductor apparatus of claim 6, wherein the internal circuit is configured to include a semiconductor memory device.

10. The semiconductor apparatus of claim 9, wherein the semiconductor memory device is configured to include a volatile memory device or a nonvolatile memory device.

11. An input circuit comprising:
    a buffer unit configured to be driven according to a first bias voltage and second bias voltage received by the buffer unit regardless of a level change of an external signal and a reference signal received by the buffer unit, and output an internal signal,
    wherein the buffer unit is further comprises;
    a first buffer unit configured to be turned on or turned off according to the first bias voltage and the second bias voltage, and generate a first comparison signal and a second comparison signal by comparing the reference signal and the external signal; and
    a second buffer unit configured to be turned on or turned off according to the first bias voltage and the second bias voltage, and generate the internal signal by comparing the first comparison signal and the second comparison signal received from the first buffer unit.

12. The input circuit of claim 11, further comprising:
    a bias generation unit configured to generate the bias voltage in response to an enable signal.

13. The input circuit of claim 12, wherein, when the enable signal is enabled, the first bias voltage is generated to a level capable of turning on a current sink element for driving a sink current of the buffer unit and the second bias voltage is generated to a level capable of turning on a current source element for driving a source current of the buffer unit.

14. The input circuit of claim 13, wherein, when the enable signal is disabled, the first bias voltage is generated to a ground voltage level capable of turning off a switching element of the buffer unit and the second bias voltage is generated to a power voltage level capable of turning off a switching element of the buffer unit.

15. The input circuit of claim 11, further comprising:
a bias generation unit configured to generate a level of the bias voltage capable of turning on a switching element included in the buffer unit to allow the buffer unit to be driven even though the level of the external signal has changed.

16. The input circuit of claim 11, further comprising:
a bias generation unit configured to generate the first bias voltage for driving a sink current of the buffer unit, and the second bias voltage for driving a source current of the buffer unit as the bias voltage.

* * * * *